United States Patent [19]

Fraser, Jr. et al.

[11] 4,290,034
[45] Sep. 15, 1981

[54] SWITCHED CAPACITOR FILTER

[75] Inventors: Donald L. Fraser, Jr., Warren Township, Somerset County, N.J.; Armando J. Vera, Methuen, Mass.

[73] Assignee: Bell Telephone Laboratories, Incorporated, Murray Hill, N.J.

[21] Appl. No.: 150,459

[22] Filed: May 16, 1980

[51] Int. Cl.³ .............................................. H03H 19/00
[52] U.S. Cl. ..................................... 333/173; 328/167
[58] Field of Search ............................... 333/172–174, 333/165; 328/165, 167; 307/238, 295, 239–244, 246

[56] References Cited
U.S. PATENT DOCUMENTS 3,469,213 9/1969 Baker .................................. 333/173
3,514,726 5/1970 Poschenrieder ................... 333/174

OTHER PUBLICATIONS

Brodersen et al–"MOS Switched-Capacitor Filters", Proc. of the IEEE, vol. 67, No. 1, Jan. 1979; pp. 61–75.
Fried–"Analog Sample-Data Filters", IEEE Journal of Solid-State Circuits, vol. SC-7, Aug. 1972; pp. 302–304.

*Primary Examiner*—Marvin L. Nussbaum
*Attorney, Agent, or Firm*—Lester H. Birnbaum

[57] ABSTRACT

A switched capacitor filter circuit which closely matches single pole RC filters at voice frequency. The filter pole is determined by the ratio of a first and second capacitor ($C_1$ and $C_2$). Any resulting loss is compensated for by an operational amplifier (13) in combination with third and fourth capacitors ($C_3$ and $C_4$) operating as a voltage divider circuit. A switch (16) may be provided for discharging one of the latter capacitors during nonsampling intervals. A further switch (17) may also be provided to cancel charge due to gate-to-drain overlap of the first switch.

7 Claims, 3 Drawing Figures

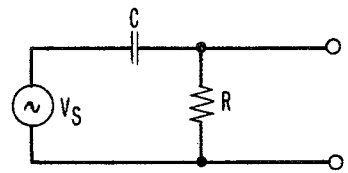
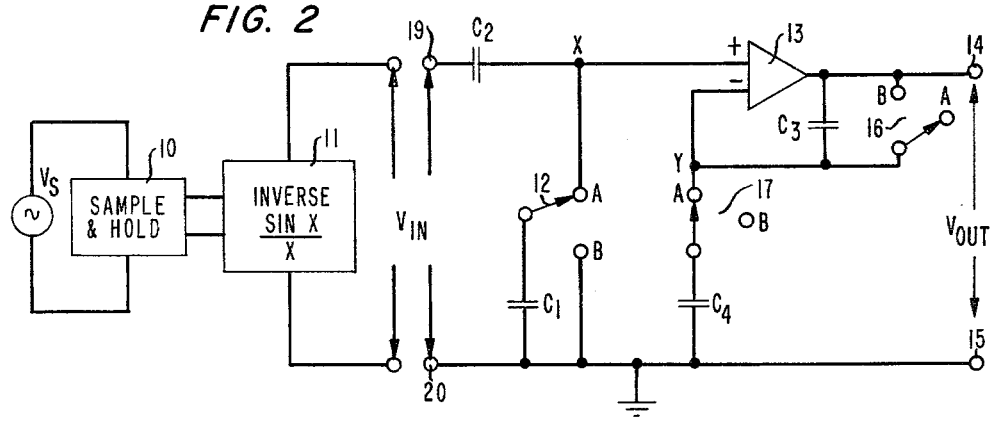
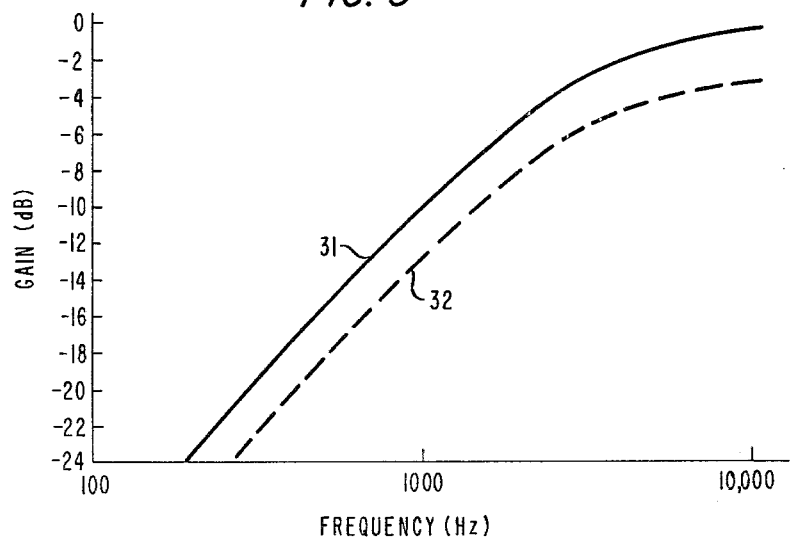

SWITCHED CAPACITOR FILTER

BACKGROUND OF THE INVENTION

This invention relates to filter circuits, and in particular, to a switched capacitor filter circuit which closely matches an RC filter circuit.

Filters employing thin film resistor and capacitor combinations are quite advantageous in a number of applications, especially as high pass filters in telecommunications systems. Such a simple RC filter is illustrated in FIG. 1. For such a circuit, it is known that the filter pole $f_p$ will be determined by the relationship:

$$f_p = \frac{1}{2\pi RC} \qquad (1)$$

where R is the resistance of the resistor, and C is the capacitance of the capacitor.

Such filters can provide extremely high accuracy. However, it would be more economical if the filter could be integrated onto a semiconductor chip. Unfortunately, it is difficult to fabricate a resistor having the accuracy required for precision filters with present integrated circuit technology. Capacitors can be fabricated with the necessary accuracy, however, and it has therefore been suggested that a switched capacitor could simulate the function of a resistor. Thus, a sampled-data filter integrated circuit which matched the RC filter response could be achieved. (See, for example, Brodersen et al, "MOS Switched-Capacitor Filters", *Proceedings Of The IEEE*, Vol. 67, No. 1, pp. 61-75 (January 1979)). Various designs of switched capacitor filters involving various approximations have been proposed as an RC filter equivalent (see, e.g., Fried, "Analog Sample-Data Filters", *IEEE Journal Of Solid-State Circuits*, Vol. SC-7, pp. 302-304 (August 1972)). Most prior art suggestions do not provide a close match to the RC circuit for desirably low switching frequencies (e.g., 30 KHz) where the input frequency is above 1 KHz.

It is therefore a primary object of the invention to provide a switched capacitor filter circuit which closely matches the frequency response of an RC filter circuit without significant insertion loss.

SUMMARY OF THE INVENTION

This and other objects are achieved by the sampled-data filter circuit in accordance with the invention. The circuit includes an input portion, an output portion and a reference portion. First and second capacitors are provided with one electrode of at least one capacitor coupled to the reference portion and one electrode of the other capacitor coupled to the output portion. Switching means are also provided for alternately connecting one electrode of said first capacitor to two of said portions so as to simulate the electrical characteristics of a resistor. A particular ratio of capacitances is chosen to achieve close simulation of an RC filter response. Gain may be provided to the response by an operational amplifier with one input coupled to the filter output portion, a third capacitor coupled between the output of the amplifier and another input of the amplifier, and a fourth capacitor coupled between the input of the amplifier and the reference portion. Additional switching means may also be coupled to each of said third and fourth capacitors.

BRIEF DESCRIPTION OF THE DRAWING

These and other features are delineated in detail in the following description. In the drawing:

FIG. 1 is a circuit diagram of a prior art high pass RC filter circuit;

FIG. 2 is a schematic circuit diagram of a sampled-data filter circuit in accordance with one embodiment of the invention; and FIG. 3 is a graph of the frequency response of the circuit in accordance with the embodiment of FIG. 2 compared with the circuit of FIG. 1.

DETAILED DESCRIPTION

One embodiment of the invention is illustrated in the circuit diagram of FIG. 2 showing a high pass filter and appropriate input functions. Such a circuit, as discussed in more detail below, is intended as an electrical equivalent to the filter circuit of FIG. 1, but in a form which is easily integrated into a semiconductor chip.

In order to provide the proper input voltage, $V_{in}$, to the filter circuit, there are provided, according to standard practice, means (10) for sampling the a.c. analog signal, $V_s$, and holding the signal for a predetermined interval. In this particular example, the holding interval was approximately 33 microseconds for a sampling rate of 30 KHz. Since it is known that such sampling introduces an error in amplitude of sinx/x, means, 11, was provided to correct this distortion. Since the circuitry for providing the sampled data is well known in the art, it is not shown. It will also be realized that these input functions are shown for illustration and may not be directly connected to the filter of the present invention, but rather may appear at some other portion of the system in which the filter is used.

A sampled data signal, $V_{in}$, will appear at input terminals 19 and 20 of the filter. (It should be apparent that since the filter will most likely be interconnected with other circuits, it will probably not have identifiable input or output terminals for off-chip connection. Thus, the terminals here are intended to be illustrative of input and output portions of the circuit shown.) Terminal 20 is coupled to ground potential and so is considered part of the reference portion of the circuit. Coupled to the input terminal 19 was one electrode of a first capacitor $C_2$. The other electrode of the capacitor was coupled to the output portion of the filter indicated as "X". Also coupled to the output portion through a switch 12 was one electrode of a second capacitor $C_1$. The other electrode of the second capacitor was coupled to the reference portion. The switch 12 was coupled to permit alternatively coupling the one electrode of capacitor $C_1$ between the output portion and the reference portion. In this example, the output portion (X) of the filter was coupled to the noninverting input (designated "+") of a standard operational amplifier 13. The output of the operational amplifier was coupled to one output terminal 14. Output terminal 15 was at ground potential.

A third capacitor, $C_3$, was coupled between the output of the op amp and the inverting input (designated "−") of the op amp. Switching means 16 was coupled in parallel with the capacitor $C_3$ so as to permit the capacitor to be discharged and to apply a known d.c. potential to the op amp input during nonsampled intervals. One electrode of a fourth capacitor, $C_4$, was also coupled to the inverting input of the op amp through switching means 17. The other electrode of the fourth capacitor was coupled to the reference portion.

In operation, it is known that if the signal $V_{in}$ is applied at the input portion, the combination of $C_1$ and switch 12 can be made to simulate the electrical characteristics of the resistor of an RC filter. At the beginning of each sampling interval, the switch will be at position A and at approximately the middle of the interval will switch to position B. It is known that the filter response which appears at X will be a function of the ratio of the capacitors and the sampling frequency $f_s$ of the clock which drives the switches. Determination of the capacitor ratio in most prior art filters has involved first order approximations which do not provide a sufficiently close match when the ratio of sampling frequency to pole frequency is 30 or less.

In accordance with the present invention, however, a ratio of capacitors is provided which gives a switched capacitor filter having a response which is essentially an exact equivalent to an RC circuit. The proper capacitor ratio was found by considering the S domain, which is a Laplace transform from the time domain to the frequency domain, and matching one real pole in the said domain to one pole of the RC circuit. It can be shown that the poles in the S domain are:

$$\sigma = \frac{1}{T} \ln \left[ \frac{C_2}{C_1 + C_2} (-1)^n \right] \quad (2)$$

where T is the sampling interval, and n is an integer.

Matching the first pole (n=0) with the RC pole ($1/RC_2$) gives:

$$\frac{C_1}{C_2} = e^{\frac{2\pi f_p}{f_s}} - 1 \quad (3)$$

where $f_p$ is the pole frequency, and $f_s$ is the sampling frequency. Thus, given the desired pole and sampling frequencies, an appropriate choice of capacitor ratios may be determined. For example, with a pole frequency $f_p$ of 3 KHz and a desirably low sampling frequency $f_s$ of 30 KHz, a ratio, $C_1/C_2$, of 0.87446 was utilized. In such a case, it was determined that the frequency response of the switched capacitor filter would exactly track that of the RC circuit but with an insertion loss of 2.88 dB. This is illustrated in FIG. 3 where solid curve 31 is the response of the RC circuit shown in FIG. 1 and broken line curve 32 is the response at X of the circuit shown in FIG. 2. The switched capacitor filter deviated from the RC filter by only ±.03 dB up to 10 KHz.

Thus, it will be understood that the capacitor ratio in accordance with one aspect of the invention provides an essentially exact equivalent to an RC circuit at low sampling rates (minus some constant insertion loss). Typically, the filter would be used with sampling frequencies in the range 10 KHz–500 KHz and with a ratio of sampling frequency to pole frequency as low as 3. While there is no upper limit on the ratio, the invention is most advantageous when the ratio is 30 or less where prior art circuits do not provide a good match.

The remainder of the circuit to the right of node X served to essentially eliminate the insertion loss produced by the switched capacitor. Gain was provided by the operational amplifier 13 in combination with capacitors $C_3$ and $C_4$. Output voltage from the op amp 13 was divided at node Y by the presence of the capacitors. The divided voltage was supplied to the inverting input ("−") thereby raising the reference level at the input. Since the output of the op amp is a function of the difference in voltage at the two inputs, gain is produced. The amount of voltage division is a function of the capacitance values of $C_3$ and $C_4$. The values of capacitance to achieve a particular gain $|H|$ at a frequency f is found by finding the absolute value of the transfer function in the Z domain and solving for $\beta'$ which equals $$\frac{C_3}{C_3 + C_4}.$$

This gives the relationship:

$$\frac{C_4}{C_3} = |H| \left[ \frac{1 + \beta^2 - 2\beta \cos(2\pi fT)}{2\beta^2 [1 - \cos(2\pi fT)]} \right]^{\frac{1}{2}} - 1 \quad (4)$$

$$\text{where } \beta = \frac{C_2}{C_1 + C_2}.$$

Switch 16 was provided in parallel with capacitor $C_3$ to maintain a known d.c. potential at the op amp input and discharge the capacitor at nonsampling intervals. (All switches will move simultaneously to position A at the start of a sampling interval and to position B at about the midpoint of the interval.) Switch 17 was employed for charge cancelling. That is, when switch 16 is an MOS transistor, excess charge generated in switch 16 during the "A" state due to gate-to-drain overlap can be collected by switch 17 when both switch to the "B" state.

In this particular example, the ratio of capacitances $C_4/C_3$ was 0.392. This was found to provide the required gain of 2.88 dB to make the switched capacitor filter the equivalent of the RC circuit. The frequency response of the filter according to the present invention varied from the RC circuit by no more than +0.03 dB of the equivalent RC circuit.

The particular circuit described thus far was composed of discrete elements, namely, n channel MOS transistors as the switches, standard mica capacitors, and an MOS input op amp with a gain of 10,000 which is sold by Analog Devices. This discrete version demonstrated the equivalence of the circuit to the RC filter. An integrated circuit utilizing these basic principles was also fabricated. It included double-polysilicon capacitors, n channel MOS transistors as switches and an all-enhancement MOS amplifier with a gain of 1,000. The circuit was operated at a sampling frequency of 8 KHz. Although a comparison with an RC circuit was not made, it was shown that the filter pole was as predicted by the principles of the present invention.

Although the circuit of FIG. 2 shows a portion for achieving gain, it is understood that such portion could be eliminated if the insertion loss produced by the switched capacitor is tolerable. It will also be clear that although a high pass filter is illustrated, the invention is also applicable to a low pass filter where the position of the capacitor $C_1$ and switch 12 is interchanged with the capacitor $C_2$. In such cases, equations 3 and 4 will be equally applicable if $C_1$ designates the switched capacitor, and $C_2$ designates the other capacitor. It is known in such circuits that $C_1$ will be charged with the voltage at the input terminal 19 in the "A" state and discharged to the output portion X in the "B" state.

Various additional modifications will become apparent to those skilled in the art. All such variations which basically rely on the teachings through which the invention has advanced the art are properly considered within the spirit and scope of the invention.

We claim:

1. A sampled-data filter circuit comprising: at least one input portion (19), at least one output portion (X) and at least one reference level portion (20,15); first and second capacitors ($C_1$ and $C_2$) with one electrode of at least one capacitor ($C_1$) coupled to the reference portion and one electrode of the other capacitor ($C_2$) coupled to the output portion, and switching means (12) for alternatively connecting one electrode of said first capacitor to two of said portions so as to simulate the electrical characteristics of a resistor between said portions, CHARACTERIZED IN THAT the capacitances of said first and second capacitors have a value in accordance with the relationship:

$$C_1/C_2 = e^{\frac{2\pi f_p}{f_s}} - 1$$

where $f_p$ is the pole frequency of the filter and $f_s$ is the sampling frequency.

2. The circuit according to claim 1 wherein the ratio of the sampling frequency to pole frequency is 3 to 30.

3. The circuit according to claim 1 wherein one electrode of the second capacitor is coupled to the input, the other electrode of said second capacitor is coupled to the output, one electrode of the first capacitor is coupled to the reference portion and the other electrode of the first capacitor is coupled alternatively to the output portion and the reference portion by the switching means so that the circuit comprises a high pass filter.

4. The circuit according to claim 1 further comprising means coupled to said output portion for amplifying the signal at said output, said means comprising an operational amplifier (13) with one input coupled to the filter output (X), a third capacitor ($C_3$) coupled between the output of the operational amplifier and another input of said operational amplifier, a fourth capacitor ($C_4$) coupled between said another input and the reference portion, and second switching means (16) coupled in parallel to said third capacitor.

5. The circuit according to claim 4 wherein the ratio of the capacitances of the third and fourth capacitors is given by the relationship:

$$C_4/C_3 = |H| \left[ \frac{1 + \beta^2 - 2\beta \cos(2\pi fT)}{2\beta^2 [1 - \cos(2\pi fT)]} \right]^{\frac{1}{2}} - 1$$

where $|H|$ is the desired gain at frequency f, T is the switching interval, and $$\beta = \frac{C_2}{C_1 + C_2}.$$

6. A sampled-data filter circuit comprising at least one input portion (19), at least one output portion (X) and at least one reference level portion (20,15); first and second capacitors ($C_1$ and $C_2$) with one electrode of the second capacitor coupled to the input, the other electrode of the second capacitor coupled to the output, one electrode of the first capacitor coupled to the reference portion, and switching means (12) for alternatively coupling the other electrode of the first capacitor to the output portion and the reference portion so as to simulate the electrical characteristics of a resistor between said portions, CHARACTERIZED IN THAT the capacitances of said first and second capacitors have a value in accordance with the relationship:

$$C_1/C_2 = e^{\frac{2\pi f_p}{f_s}} - 1$$

where $f_p$ is the pole frequency of the filter and $f_s$ is the sampling frequency.

7. A sampled data filter circuit comprising: at least one input portion (19), at least one output portion (X), and at least one reference portion (20,15); first and second capacitors ($C_1$ and $C_2$) with one electrode of the second capacitor coupled to the input, the other electrode of the second capacitor coupled to the output, and one electrode of the first capacitor coupled to the reference portion; first switching means (12) for alternatively coupling the other electrode of the first capacitor to the output portion and the reference portion so as to simulate the electrical characteristics of a resistor between said portions; and means for amplifying the signal at the output portion, CHARACTERIZED IN THAT the capacitances of said first and second capacitors have a value in accordance with the relationship:

$$C_1/C_2 = e^{\frac{2\pi f_p}{f_s}} - 1$$

where $f_p$ is the pole frequency of the filter and $f_s$ is the sampling frequency; and the amplifying means comprises: an operational amplifier with one input coupled to the output of the first and second capacitors, a third capacitor ($C_3$) coupled between the output of the operational amplifier and another input of said operational amplifier, a fourth capacitor ($C_4$) coupled between said another input and the reference portion, second switching means (16) coupled in parallel with the third capacitor, and third switching means (17) coupled in series between the fourth capacitor and the another input of the operational amplifier, wherein the capacitances of the third and fourth capacitors have a value which satisfies the relationship:

$$C_4/C_3 = |H| \left[ \frac{1 + \beta^2 - 2\beta \cos(2\pi fT)}{2\beta^2 (1 - \cos(2\pi fT))} \right]^{\frac{1}{2}} - 1$$

where $|H|$ is the desired gain at frequency f, T is the switching interval, and $$\beta = \frac{C_2}{C_1 + C_2}.$$

* * * * *